United States Patent [19]

Avalon

[11] 4,180,893
[45] Jan. 1, 1980

[54] APPARATUS FOR CUTTING A SEGMENT FROM A STRIP OF FILM AND MOUNTING THE SEGMENT IN A FIXTURE

[75] Inventor: Max Avalon, Phoenix, Ariz.

[73] Assignee: Honeywell Information Systems, Inc., Phoenix, Ariz.

[21] Appl. No.: 921,640

[22] Filed: Jul. 3, 1978

[51] Int. Cl.[2] .......................................... B23Q 39/02
[52] U.S. Cl. ..................................... 29/33 K; 29/740; 83/81; 83/95
[58] Field of Search .................... 29/566, 566.1, 33 K, 29/33 S, 740, 566.2; 83/95, 81

[56] References Cited

U.S. PATENT DOCUMENTS

| 3,274,665 | 9/1966 | Higginson et al. ................. 29/33 K |
| 4,079,489 | 3/1978 | Kowalski et al. .................. 29/33 K |

*Primary Examiner*—Gil Weidenfeld
*Attorney, Agent, or Firm*—Edward W. Hughes; William W. Holloway, Jr.; Ronald T. Reiling

[57] ABSTRACT

Apparatus for cutting segments from a strip of film and for mounting the segments in reusable fixtures. Each segment is severed from the strip and mounted in a single cycle of operation of the apparatus. A cutting die is provided with a nonlinear symmetrical cutting edge lying in a die cutting plane. A punch is provided with a bottom surface substantially the size of a segment. The cutting plane of the punch has a linear punch cutting edge formed at the intersection of the bottom surface and the punch cutting plane, and the punch is mounted in cutting relationship with the die. Positioning means position the strip so that a boundary between segments lies in the die cutting plane. As the punch moves toward the die and a fixture located below the die, a segment is severed from the strip by the cutting action of the punch and die cutting edges which co-operate to minimize the forces applied to the segment tending to change the orientation of the segment to the punch. The punch is also provided with a pair of segment retaining pins to further minimize movement of the segment relative to the bottom surface of the punch during the severing step and until the segment is mounted in the fixture by the punch which occurs substantially at the end of the punch's down stroke when the punch forces the attachment webs of the segment between pairs of retention lugs of the fixture. The punch is provided with lug receiving recesses into which the retention lugs of the fixture can project.

12 Claims, 7 Drawing Figures

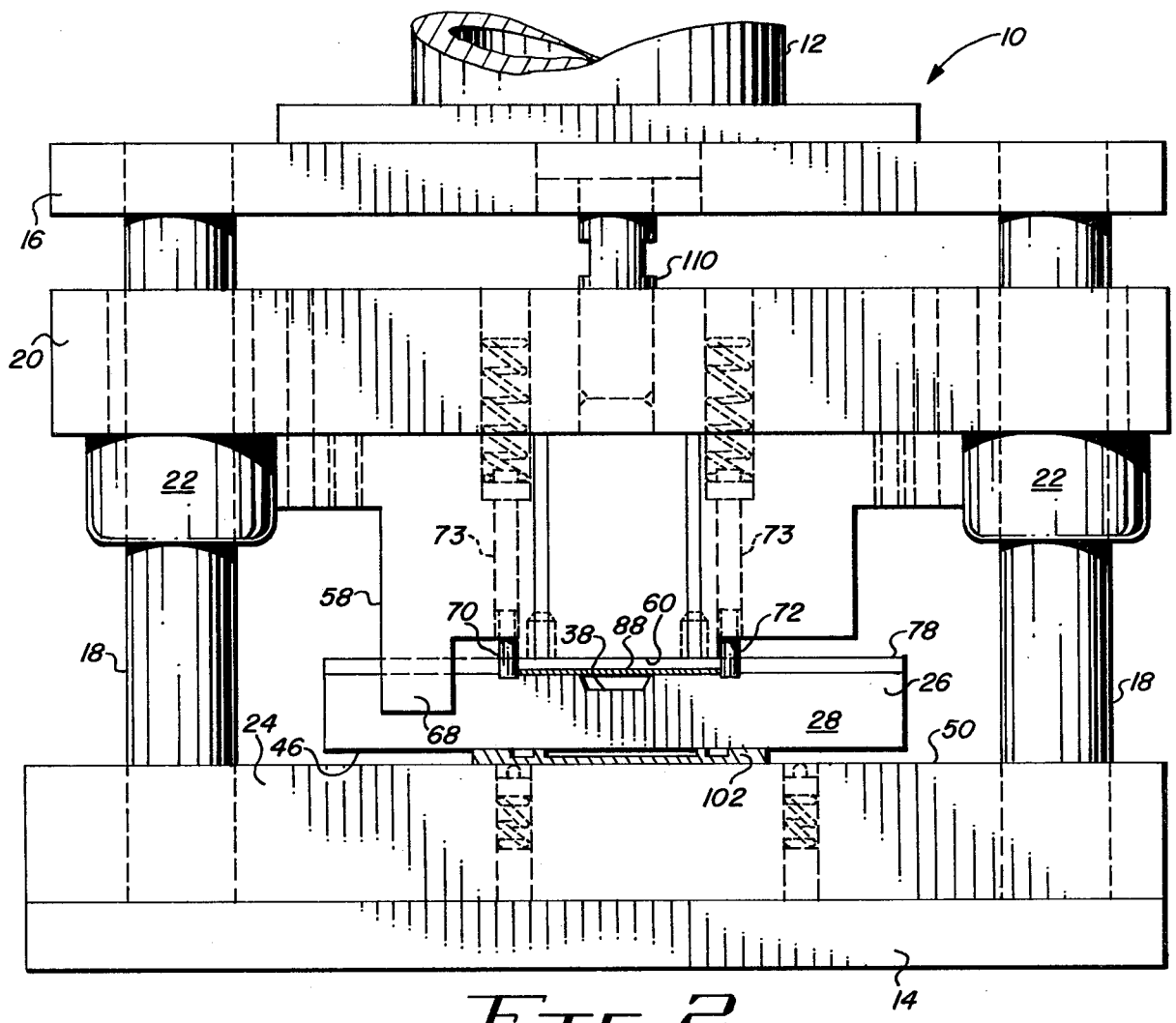
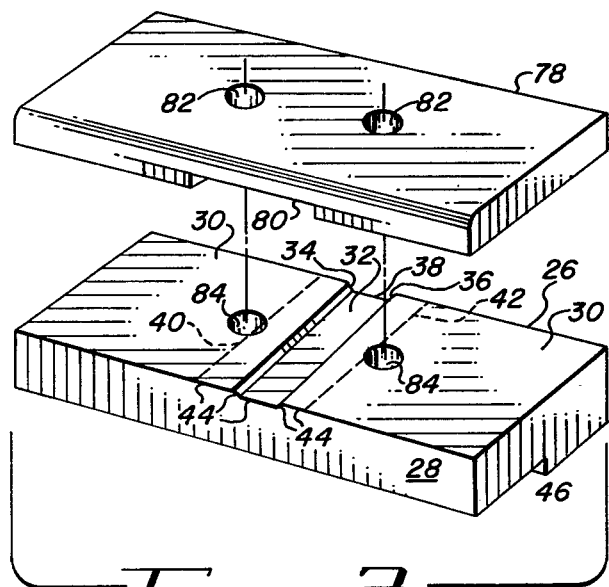
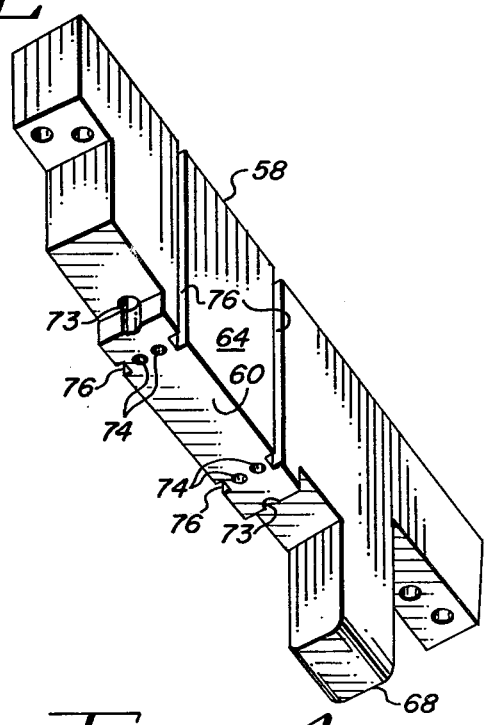

APPARATUS FOR CUTTING A SEGMENT FROM A STRIP OF FILM AND MOUNTING THE SEGMENT IN A FIXTURE

BACKGROUND OF THE INVENTION

1. Field of the Invention

This invention is in the field of apparatus for serially cutting segments from a strip of material and loading the severed segments into fixtures with a segment being severed from a strip and loaded into a fixture in a single cycle of operation of the apparatus.

2. Description of the Prior Art

The development of integrated circuits (IC) chips, particularly medium and large scale IC chips has created a need for improved manufacturing processes to automate the mounting of such chips on substrates or in packages. It is known to attach IC chips to lead frames formed on relatively long strips of a tape-like carrier similar to standard motion picture film. The lead frames are formed from a thin metalic layer of a suitable electrical conductor such as copper which is bonded to the film. The strip is divided into equal sized segments and the layer of metal within each segment is formed into lead frames of a desired configuration by conventional photoetching processes. Subsequently the IC chips are bonded to each lead frame. The length of such strips of film are such that to facilitate handling and shipping the strips are wound on reels. Normally IC chips of the same type are mounted on a given film strip.

Reusable fixtures suitable for use with the apparatus of this invention for holding a segment of a film strip are described and claimed in U.S. Pat. No. 4,069,496 which issued on Jan. 17, 1978 which Patent is entitled "Reusable Fixture for an Integrated Circuit Chip" and it is assigned to the same assignee as the present invention.

Apparatus, such as punch presses, for cutting a segment of a film strip to which segment an IC chip is bonded at the boundaries between the segments are known. Also, apparatus for fastening, or mounting such a segment in a reusable fixture by forcing the attachment webs of a segment which are located between adjacent attachment sprocket holes of the segment exist. However, apparatus for cutting a segment from a strip of such segments and mounting a segment on a reusable fixture substantially simultaneously in a single cycle of operation of the press reliably and substantially without damage to the IC chips and their lead frames mounted on a segment has not heretofore existed.

SUMMARY OF THE INVENTION

The present invention provides apparatus for cutting a segment of a strip of film which film strip is comprised of a plurality of substantially equal size segments and for mounting each segment as severed on a reusable fixture in a single cycle of operation of the apparatus. The apparatus, a modified punch press, is provided with a die having a planar die cutting surface. The top surface of the die intersects the die cutting surface to form a nonlinear but symmetric die cutting edge. The punch is provided with a planar segment mounting surface of substantially the same size as that of a segment, a planar punch cutting surface, and a punch support planar surface substantially parallel to the punch cutting surface and spaced from it a distance substantially equal to that of the length of a segment. The intersection of the segment mounting surface and the planar punch cutting surface defines the punch cutting edge. A die block which has a planar stabilizing surface is mounted on the press so that its stabilizing surface is substantially parallel to the die cutting plane and spaced from it a distance substantially equal to that of the length of a segment. The punch is provided with a pilot, or heel, having a pair of planar bearing surfaces, one of which is adapted to slidingly engage the die cutting surface and the other the stabilizing surface of the die block. The die is provided with film guiding means which in co-operation with film positioning means movable with the punch position the film strip on the die so that a boundary between segments lies in the plane of the die cutting surface. The punch is provided with segment holding pins to hold or restrain a segment projecting beyond the cutting plane of the die and underlying the punch from moving relative to the segment mounting surface of the punch during the cutting operation and for holding the segment relatively fixed with respect to the punch to prevent lateral and rotational movement of a segment until the segment is mounted in a reusable fixture. Fixture positioning means are formed in the die and die block so that the segment receiving recess of a fixture can be positioned directly below the segment mounting surface of the punch. The punch is provided with recesses into which the attachment lugs of the fixture project.

The punch moves from a first position in which the film strip can be advanced under the segment engaging surface of the punch to a second position in which the segment mounting surface of the punch is spaced from the bottom wall of a segment receiving recess of a fixture properly located in the fixture positioning means a distance substantially equal to the thickness of a segment. As the film strip is advanced to place a segment in proper position to be severed, the sides of the segment are lightly gripped by the segment holding pins. As the punch moves toward its second position the punch and die cutting edges sever the projecting segment from the strip. The shape of the die cutting edge relative to the punch cutting edge is chosen to minimize any forces tending to displace the segment relative to the punch during the severing step. The segment holding pins also prevent lateral or rotational movement of both of the segments relative to the punch until the segment is mounted in a fixture. As the punch moves to its second position the attachment lugs of the fixture are forced through the attachment sprocket holes in the segment so that the protrubrances of the lugs overlie the attachment webs of the segment. The punch is then returned to its first position completing a cycle of operation. The fixture with a segment mounted in it is removed from the fixture positioning means and an empty fixture is then placed in the fixture holder, the film strip is advanced one segment and the apparatus is ready to repeat its cycle of operation.

The present invention solves the prior art problem of providing apparatus to automate the severing of a segment from a strip of such segments and mounting the severed segment in a reusable fixture. The apparatus of the present invention performs its operation with a high degree of precision, reliably, and with an acceptably low risk of damage to the IC chips mounted on the segments essentially simultaneously during a single cycle of operation of the apparatus.

It is therefore an object of this invention to provide apparatus for cutting a segment from a continuous strip of such segments and mounting the severed segment on a reusable fixture, all in a single operation of the apparatus.

It is a further object of this invention to provide apparatus for cutting a segment from a continuous strip of such segments and mounting the severed segment into a fixture in which the cutting edges of the punch and die are shaped to minimize the forces applied to the segment which tend to change the position of the segment relative to the punch.

It is still a further object of this invention to provide apparatus including a punch and die for cutting a segment from a strip and mounting the severed segment in a fixture in which the punch is provided with means for holding a severed segment to prevent misalignment of the severed segment with the fixture onto which it is to be mounted from the time the segment starts being severed from the strip until it is mounted in a fixture.

BRIEF DESCRIPTION OF THE DRAWINGS

Other objects, features and advantages of the invention will be readily apparent from the following description of the preferred embodiment thereof, taken in conjunction with the accompanying drawings, although variations and modifications may be effected without departing from the spirit and scope of the novel concepts of the disclosure, and in which:

FIG. 2 is a section taken on line 2—2 of FIG. 1.

FIG. 3 is an enlarged exploded perspective view of the die and its cover plate.

FIG. 4 is a perspective view of the punch.

DESCRIPTION OF THE INVENTION

Figure 1:
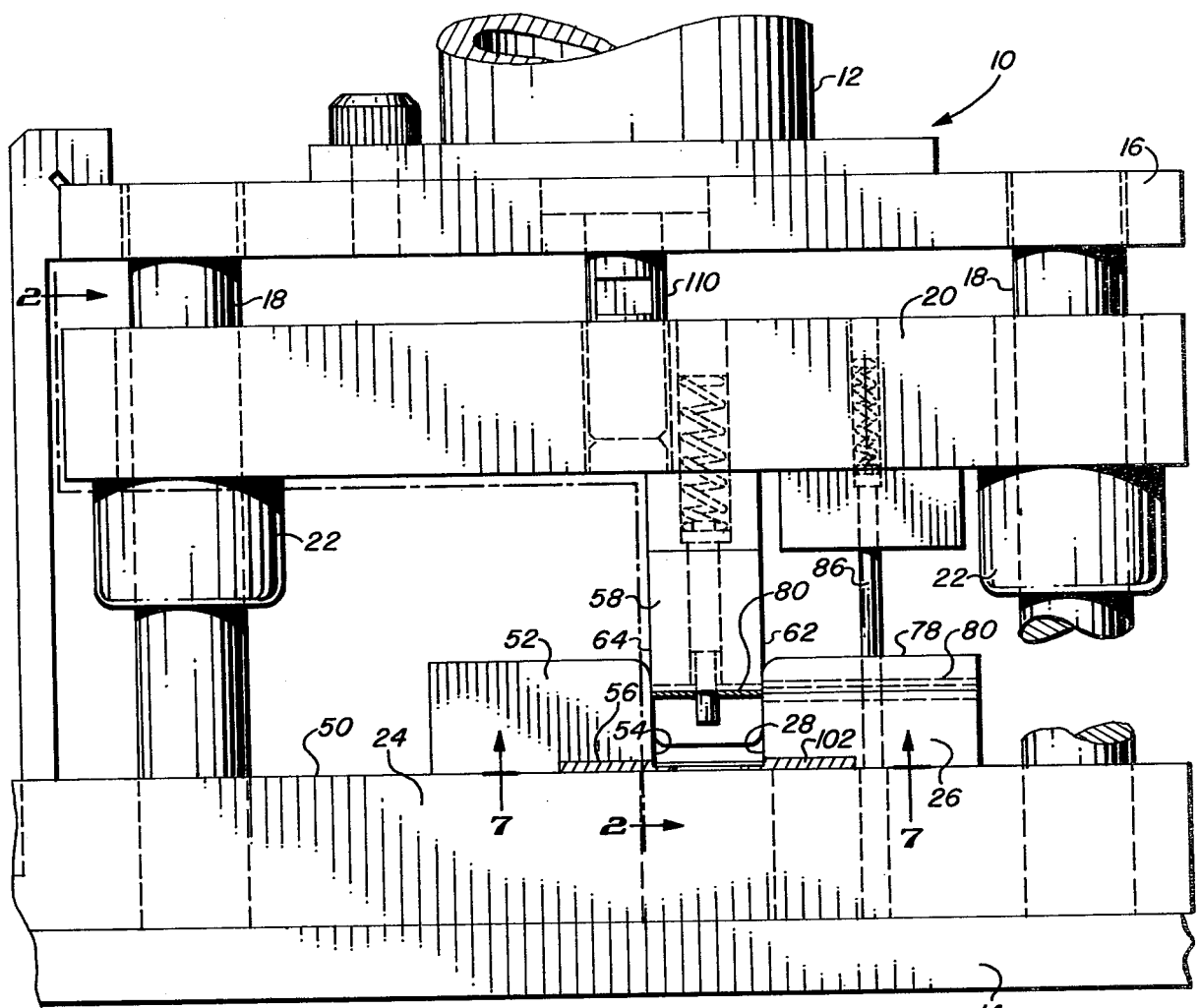
FIG. 1 is a front elevation of the apparatus of the invention.

In FIG. 1, punch press 10 is a conventional punch press which may be energized in any suitable manner including by hand, but in the preferred embodiment is powered by conventional pneumatic actuator 12. Bottom, or base plate 14 of press 10 is mounted on a conventional substantially rigid support, or base, which is not illustrated. Top plate 16 of punch press 10 is fixedly mounted, or positioned with respect to base plate 14 by four metal dowels 18. Punch holder 20 is mounted on dowels 18 by ball bushings 22 for reciprocal linear movement with respect to base plate 14. Die holder 24 is removably secured to base plate 14 by conventional fastening means such as bolts that extend through base plate 14 and are threaded into die holder 24, which fastening means are not illustrated.

Cutting die 26 has a planar sidewall 28, as is best seen in FIG. 3, which defines the planar die cutting surface of die 26. Die 26 has a first upper planar surface 30 and a second upper planar surface 32 which is spaced a predetermined distance below planar surface 30 and is substantially parallel to surface 30. Surfaces 30 and 32 are connected, or joined, by angled planar surfaces 34, 36 the intersection of surfaces 30, 32 with angled surfaces 34, 36 form substantially equal angles. Describing their relationship in another way, surfaces 34, 32 and 36 form channel 38 in die 26 the cross section of which is substantially an isosceles trapezoid. The intersections of surfaces 28, 30, 34, 32 and 36 between the boundaries of lines 40, 42 define die cutting edge 44 a nonlinear symmetrical cutting edge. A rabbet 46 is formed along the bottom edge of sidewall 28 in die 26. Cutting die 26 is mounted on die holder 24 so that die cutting surface 28 is substantially perpendicular to the substantially planar top surface 50 of die holder 24.

Die block 52 has a side wall 54 which defines a substantially planar stabilizing surface. Die block 52 is also provided with a rabbet 56 which is formed along the bottom edge of side wall 54. As can be seen in FIGS. 1 and 2, die block 52 is shaped similarly to die 26, a major difference being that the intersection of its planar top surface with side wall 54 does not define a cutting edge and in the preferred embodiment is rounded. Die block 52 is mounted on die holder 24 so that stabilizing surface 54 is substantially parallel to die cutting surface 28 of die 26 and is spaced from it a predetermined distance.

Punch 58, as can best be seen in FIG. 4, has a bottom planar wall, or segment mounting surface, 60 and a pair of planar side walls 62, 64 only wall 64 is seen in FIG. 4. Wall 64 is a punch support surface and wall 62 is the punch cutting surface. The two surfaces 62, 64 are substantially parallel to each other. The intersection of surfaces 60 and 62 define a substantially linear horizontal punch cutting edge 66. Punch 58 is provided with a pilot, or heel, 68 whose side walls substantially lie in the planes of punch cutting surface 62 and support surface 64. As can be seen in FIG. 2, a pair of segment holding pins 70, 72 are resiliently mounted in bores 73 formed in punch 58 and are spring biased to extend below the bottom wall 60 of punch 58. Pins 70, 72 can be pushed upwardly so that their bottom surfaces are above wall 60 during a cycle of operation of punch press 10. Lug receiving recesses 74 and lug receiving recesses, or grooves, 76 are formed in punch 58 and intersect bottom wall 60 as is best seen in FIG. 4. Punch 58 is removably secured to punch holder 20 so that punch cutting surface 62 and die cutting surface 28 slidingly engage one another as do support surface 64 of punch 58 and stabilizing surface 54 of die block 52. Die 26 has attached to it a cover plate 78 which is provided with a film guide channel 80 and a pair of pilot bores 82 which are aligned with pilot bores 84 formed in die 26. A pair of pilot pins 86 are mounted on the punch holder 20 so that they can move within or penetrate bores 82, 84 to accurately position film strip 88 in film guide channel 80. Pins 86 are spring biased in a downwardly direction.

Figure 5:
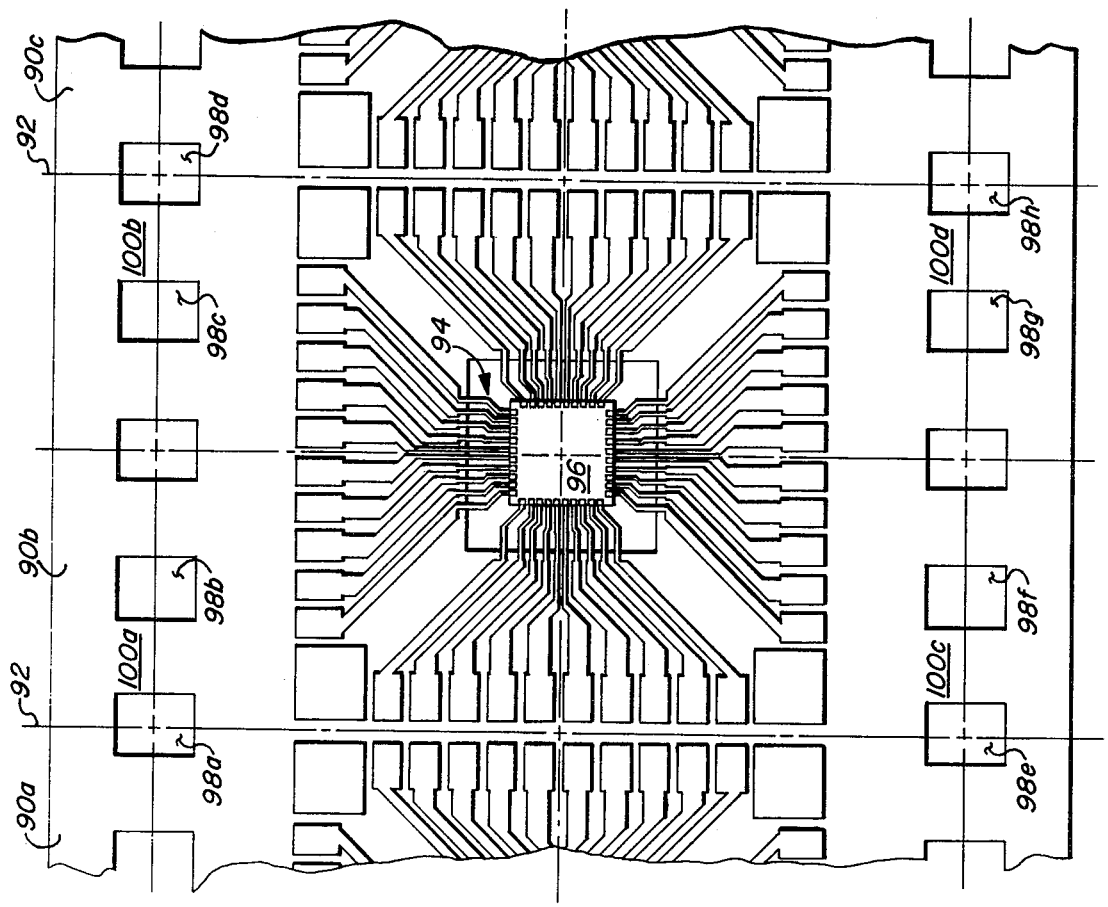
FIG. 5 is an enlarged view of a portion of a film strip.

Referring to FIG. 5, a typical film strip 88 is normally divided into a large number of segments 90 with a segment boundary 92 between each segment. Only one segment 90b and parts of adjoining segments 90a, 90c are illustrated in FIG. 5. Each segment 90 normally has a lead frame 94 to which is secured an IC chip 96. Film strip 88 is provided with uniformly spaced sprocket holes 98 which are arranged in two rows that are substantially parallel to one another. The size and positions of sprocket holes 98 are precisely controlled. Adjacent pairs of sprocket holes such as 98a, b; 98c, d; 98e, f; and 98g, h are the attachment sprocket holes of segment 90b. The portion of the film between attachment sprocket holes 98a, b; 98c, d; 98e, f; and 98g, h are the attachment webs 100a, 100b, 100c, 100d of segment 90b.

Figure 6:
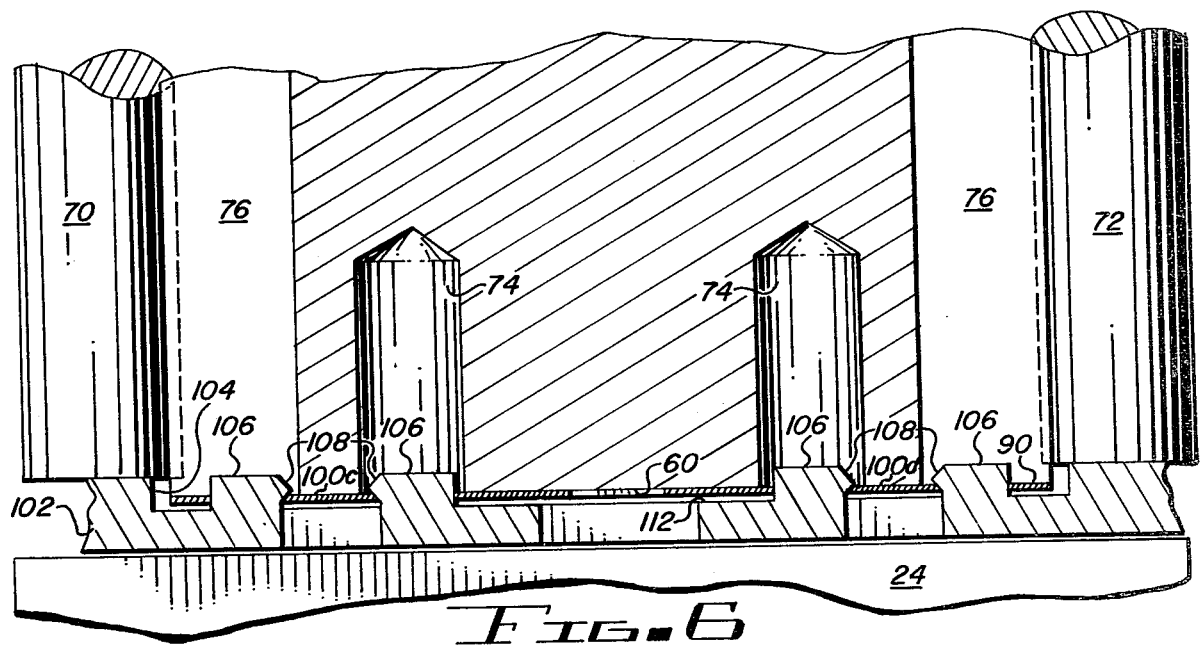
FIG. 6 is an enlarged fragmentary sectional view illustrating how the punch mounts a segment on a reusable fixture.

In FIG. 6, only the portions of a reusable fixture 102 that are significant with respect to the mounting of a segment 90 on a fixture are illustrated. For a complete description of reusable fixture, reference is made to U.S. Pat. No. 4,069,496 which issued on Jan. 17, 1978. Fixture 102 has a segment receiving recess 104 the size of which is such that a segment 90 fits into it. In recess 104 there are located four pairs of retention lugs 106, however, only two pairs of lugs are illustrated in FIG. 6. Each lug 106 is provided with a protuberance 108 which overlies an attachment web 100 when a segment 90 is mounted on fixture 102 as is illustrated in FIG. 6. Retention lugs 106 fit, or project, through the attachment sprocket holes 98 of a segment 90 and into lug receiving recesses 74, 76 of punch 58.

Figure 7:
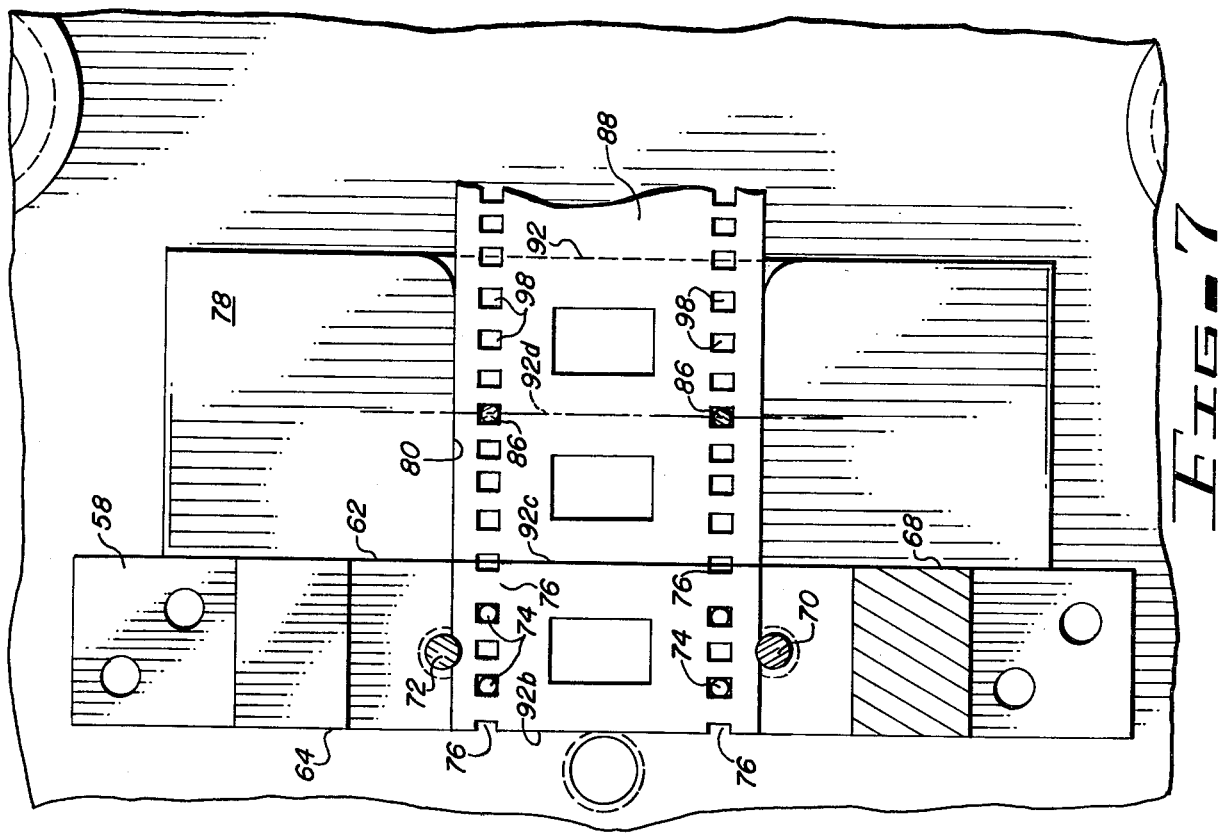
FIG. 7 is an enlarged fragmentary section taken on line 7—7 of FIG. 1.

In operation film strip 88 which is divided into a plurality of segments 90 of substantially the same size, is inserted, or fed, through film guide channel 80 in cover plate 78. The width of channel 80 is made substantially equal to the width of film strip 88. Film strip 88 is advanced until a segment 90, such as segment 90b will project across the space between die 26 and die block 52 to underlie loading surface 60 of punch 58 as is best seen in FIG. 7 with a segment boundary such as 92c substantially lying in the plane of die cutting surface 28. During the period when a segment 90 of film strip 88 is being advanced manually, or by a conventional film advancing mechanism which is not illustrated, punch 58 is held in its upward position, its initial or first position, by actuator 12 and by piston rod 110 of actuator 12 which is attached to punch holder 20. Pilot pins 86 are withdrawn, or raised, to clear channel 80 in cover plate 78. An empty reusable fixture 102 is positioned between die 26 and die block 52 using fixture positioning means which include rabbets 46, 56 formed in die 26 and die block 52 as seen in FIGS. 1 and 2. Fixture 102 is placed so that its segment receiving recess 104 is substantially directly below segment mounting surface 60 of punch 58. Reusable fixture 102 can be positioned by hand or by conventional mechanical means. The segment 90 that projects beyond the cutting plane of die 26 such as segment 90b will be lightly gripped or held by segment holding pins 70, 72 since the spacing between the nearest edges of pins 70, 72 is slightly less than the width of a segment 90 as can be seen in FIG. 7.

At the beginning of a cutting and loading cycle of operation of apparatus 10 punch holder 20 is spaced the maximum distance from base 14, its first position. Actuator 12 is energized to drive punch holder 20 downwardly toward base plate 14. Pilot pins 86 will first engage a pair of attachment sprocket holes, those sprocket holes that are bisected by a segment boundary, such as boundary 92d as seen in FIG. 7 to properly position film strip 88 so that a segment boundary such as boundary 92b will lie within the plane of die cutting surface 28 and punch cutting surface 62. As punch 58 descends, punch cutting edge 66 will move into a cutting relationship with die cutting edge 44 to sever segment 90b from film strip 88. The use of a nonlinear symmetrical die cutting edge 44 with a horizontal linear punch cutting edge 66 to sever segment 90b from strip 88 for example, applies minimal forces to segment 90b which would tend to disorient segment 90b with respect to punch 58 during the severing step. Holding pins 70, 72 also restrain movement of segment 90b during the severing step.

As actuator 12 continues to drive punch 58 downwardly toward base plate 14 the severed segment 90b which is substantially the same size and shape as that of loading surface 60 of punch 58 is held in a substantially fixed position with respect to surface 60 by segment holding pins 70, 72 until punch 58 reaches a position where the segment first contacts fixture 102. Punch 58 continues to descend to its second position in which segment mounting surface 60 is spaced from the bottom wall 112 of segment receiving recess 104 of fixture 102, a distance substantially equal to the thickness of a segment 90. As punch 58 approaches its second position, retention lugs 106 of fixture 102 are forced through attachment sprocket holes such as 98e, f and 98g, h of segment 90b and as a result the attachment webs 100c and 100d which are illustrated in FIG. 6 are forced beyond the protruberances 108 of lugs 106 which secures segment 90b to fixture 102 as seen in FIG. 6. Punch 58 is then withdrawn to its initial or first position to complete the cycle. A second cycle of operation begins by advancing film strip 88 so that another segment 90 is positioned between die 26 and die block 52 and under segment loading surface 60 of punch 58. The fixture 102 in which a segment 90 has been mounted is moved from the fixture positioning grooves, or rabbets 46, 56 and an empty fixture 102 is placed below punch 58 whereupon the cutting and loading cycle can be repeated.

Pilot or heel 68 of punch 58 slidingly engages die cutting surface 28 of die 26 and stabilizing surface 54 of die block 52 to properly align punch 58 with cutting die 26 to minimize the possibility of interference between punch 58 and die 26 during a cycle of operation. Forces acting on punch 58, particularly during the step of severing, or cutting, a segment 90, are resisted by heel 68 and by having support surface 64 of punch 58 in sliding engagement with stabilizing surface 54 of die block 52 during the cutting step which assures accurate severing of segments over many cycles of operation without the need for frequent sharpening of cutting edges 66, 44 of punch 58 and die 26.

The symmetrical nonlinear, and linear cutting edges of the punch and die and the incorporation of segment holding pins on the punch assure that a severed segment 90 will not become disoriented with respect to punch 58 and thus misaligned with the segment receiving recess 104 of fixture 102 from the time the severing action commences until segment 90 is mounted on fixture 102. This arrangement prevents damage of segments 90 and the IC chips 96 on each such segment. The pilot pins 86 and film guide channel 80 in cover plate 78 assure that film strip 88 will be properly and accurately positioned with respect to the die cutting edges 44 so that a segment boundary 92 will lie in the planes of die cutting surface 28 and punch cutting surfaces 62 which further assures the accuracy and the repeatability of the operation of apparatus 10.

From the foregoing, it is believed obvious that this invention solves the problem of cutting a segment from a strip of such segments and mounting the segment on a fixture in a single operation of the apparatus.

It should be evident that various modifications have been made to the described embodiment without distracting from the scope of the invention which claims are:

I claim:

1. Apparatus for cutting a segment from a film strip having a plurality of equal sized segments with a segment boundary between adjacent segments and for mounting a segment cut from the strip on a reusable fixture having segment retaining means, comprising:

a punch press, said punch press having a base plate, a top plate and a punch holder;

means for reciprocally moving substantially vertically the punch holder relative to the base plate between a first position in which the base plate and the punch holder are separated by a maximum distance and a second position in which they are separated a minimum distance;

a die having a planar die cutting surface and a die cutting edge lying in the die cutting surface;

means for mounting the die on the base plate;

a die block, said die block having a planar stabilizing surface;

means for mounting the die block on the base plate so that the die block is positioned so that its stabilizing surface is substantially parallel to the die cutting surface and spaced from the die cutting surface a distance substantially equal to the length of a segment;

a punch having a segment mounting surface substantially the same size as a segment, a cutting surface and a support surface, the intersection of the cutting surface and the mounting surface forming a punch cutting edge;

means for mounting the punch on the punch holder so that the punch is positioned so that the punch and die cutting edges can be placed in cutting relationship to each other and so that the support surface of the punch slidably engages the stabilizing surface of the die block;

means for positioning a film strip so that a segment boundary lies in the plane of the die cutting surface and a segment of the strip substantially directly underlies the segment mounting surface of the punch;

segment holding means mounted on said punch for holding a segment placed directly under the segment holding surface of the punch and to prevent relative movement of a severed segment relative to the punch as the punch holder moves from its first to its second position;

means for positioning a fixture under the segment cutting surface of the punch so that the segment retaining means of the fixture are directly under the segment mounting surface of the punch whereby the segment retaining means retain the severed segment as the punch holder moves from its second position to its first.

2. Apparatus as defined in claim 1 in which one of the cutting edges of the die and the punch is nonlinear and symmetrical.

3. Apparatus as defined in claim 2 in which the nonlinear symmetrical cutting edge is the die cutting edge.

4. Apparatus as defined in claim 3 in which the means for positioning a film strip include a film guide channel formed in a cover plate mounted on the die.

5. Apparatus as defined in claim 4 in which the segment holding means are a pair of segment holding pins resiliently mounted on the punch.

6. Apparatus for cutting a segment from a film strip having sprocket holes and a plurality of substantially equally sized segments, each segment having a segment boundary between adjacent segments and for mounting a segment cut from the strip on a reusable fixture having segment retaining means; comprising:

a punch press, said punch press having a base plate, a top plate, and punch actuating means mounted on said top plate;

a die mounted on said base plate, said die having a planar die cutting surface, and a nonlinear symmetrical cutting edge lying in the plane of the die cutting surface;

a die block mounted on the die holder, said die block having a planar stabilizing wall, said die block being positioned so that its stabilizing wall is substantially parallel to the die cutting surface of the die and spaced from the die cutting surface a distance substantially equal to the length of a segment;

a punch operationally connected to the actuating means for movement between a first position in which the die and the punch are separated a maximum distance and a second position in which they are separated a minimum distance;

said punch having a planar segment mounting surface substantially the same size as a segment, a planar cutting surface, and planar support surface; the intersection of the cutting surface and the mounting surface forming a linear punch cutting edge; said punch being positioned so that the punch cutting edge and die cutting edge can be placed in cutting relationship to each other and so that the punch support surface can be placed in sliding contact with the stabilizing surface of the die block;

a heel formed on the punch and projecting below the mounting surface of the punch, said heel slidingly engaging the stabilizing surface of the die block and the die cutting surface of the die prior to the punch cutting edge coming into cutting relationship with the die cutting edges as the punch actuating means moves the punch from its first to its second positions;

guide means on the die for guiding a film strip so that a segment boundary is parallel to the die cutting edges;

film positioning means mounted for movement with the punch for positioning the film strip so that a segment boundary lies in the plane of the die cutting surface;

segment holding means mounted on the punch for holding a segment placed under the segment holding surface of the punch and to prevent relative movement of a severed segment relative to the punch as the punch holder moves from its first position to its second position;

fixture guide means for guiding a fixture to a position under the segment cutting surface of the punch so that the punch mounting surface can mount a segment on the reusable fixture so that the segment retaining means retains the segment;

said segment receiving surface of the punch having recesses within which retention means of the resuable fixture project when the punch is in its second position; whereby as the punch moves from its first through second position; a segment positioned between the die cutting plane and the stabilizing surface of the die block is severed by the cutting action of the cutting edges of the punch and die and the severed segment is mounted on a fixture positioned by said fixtures guide means as the punch moves from its first to its second position.

7. Apparatus as defined in claim 6 in which the guide means includes a film guide channel formed in a cross plate mounted on the die.

8. Apparatus as defined in claim 7 in which the film positioning means includes a pair of pilot pins adapted to be inserted into predetermined sprocket holes in the film strip.

9. Apparatus as defined in claim 8 in which the segment holding means is a pair of segment holding pins resiliently mounted on the punch.

10. Apparatus as defined in claim 9 in which the distance between the segment holding pins is slightly less than the width of a segment.

11. Apparatus as defined in claim 10 in which the fixture guide means includes rabbets formed in the die and the die block.

12. Apparatus for cutting a segment from a film strip and loading the segment into a fixture; the film strip being of a substantially uniform width with rows of sprocket holes uniformly spaced along each side of the strip, the distances between sprocket holes being substantially equal, segment boundaries on said film strip dividing the strip into segments, the distance between segment boundaries being substantially equal, said fixture having a segment receiving recess, said recess having a bottom wall and four pairs of retention lugs adapted to protrude through selected ones of the sprocket holes of a segment and to overlap the retention web between said selected ones of said sprocket holes of said segment; said apparatus comprising:

a punch press, said punch press having a base plate having a planar upper surface;

a top plate fixedly positioned with respect to the base plate;

a punch holder;

means for mounting the punch holder for substantially vertical reciprocal linear motion with respect to the base plate between a first position in which the punch holder is at a maximum distance from the base plate and a second position in which the punch holder is at a minimum distance from the base plate;

means mounted on the top plate for causing the punch holder to move from its first position to its second position and to return to its first position;

die means, said die means having a first upper planar surface and a second upper planar surface spaced a predetermined distance below said first surface, said first and second upper surfaces being substantially parallel, said first and second upper surfaces being connected by a pair of angled planar upper surfaces, the intersections of the angled planar upper surfaces and the first and second upper surfaces forming substantially equal angles, side wall means forming a planar die cutting surface, said die cutting surface being substantially perpendicular to the first, second, and angled upper planar surfaces of the die, the intersection of said die cutting surface with the upper planar surfaces forming a die cutting edge;

means for mounting the die means on the base plate so that the die cutting plane is substantially perpendicular to the upper surface of the base plate;

film guide means mounted on the die for guiding a strip of film with respect to the die cutting edge of the die;

a die block having a planar side wall defining a stabilizing surface;

means for mounting the die block on the base plate so that the stabilizing surface of the die block is substantially perpendicular to the upper surface of the base plate, is parallel to the die cutting surface of the die and is spaced from the die cutting surface a distance substantially equal to the length of a segment of the film strip;

punch means, said punch means having a bottom planar segment mounting surface substantially equal in size to that of a segment and a pair of side planar walls defining a punch cutting surface and a punch support surface, said side walls being substantially normal to said mounting surface and spaced apart from one another a distance substantially equal to the length of a segment; the intersection of the loading surface and the punch cutting plane defining a punch cutting edge;

a plurality of lug receiving recesses formed in the punch, said recesses intersecting the punch mounting surface;

means for mounting the punch on the punch holder so that the punch cutting surface and the die cutting surface substantially coincide;

a pair of segment holding pins resiliently mounted on the punch and projecting below the punch mounting surface, said pins being spaced apart a distance slightly less than the width of a film segment to minimize the relative movement between a segment between said pins and the punch.

a heel formed integrally with the punch having a pair of bearing surfaces, said bearing surfaces slidably engaging the side wall means of the die and the stabilizing surface of the die block to minimize movement of the punch away from the die when a segment is being severed;

fixture positioning means for positioning a fixture so that the segment receiving recess of the fixture underlies the mounting surface of the punch, said punch when in its second position being spaced from the bottom wall of the segment receiving recess a distance substantially equal to the thickness of the film strip; and means for positioning the film strip so that a segment boundary substantially lies in the die cutting plane.

* * * * *